United States Patent
Young

(10) Patent No.: US 7,936,227 B2
(45) Date of Patent: May 3, 2011

(54) REFERENCE OSCILLATOR AND ITS USE

(75) Inventor: Phil Young, Northampton (GB)

(73) Assignee: QUALCOMM Incorporated, San Diego, CA (US)

( * ) Notice: Subject to any disclaimer, the term of this patent is extended or adjusted under 35 U.S.C. 154(b) by 28 days.

(21) Appl. No.: 12/130,271

(22) Filed: May 30, 2008

(65) Prior Publication Data

US 2008/0303601 A1    Dec. 11, 2008

(30) Foreign Application Priority Data

Jun. 1, 2007    (EP) .................................... 07109449

(51) Int. Cl.
*H03B 5/32*    (2006.01)

(52) U.S. Cl. ....... 331/158; 331/66; 331/116 R; 331/154; 331/175; 331/176; 331/177 R

(58) Field of Classification Search .................... 331/66, 331/116 R, 154, 158, 175, 176, 177 R
See application file for complete search history.

(56) References Cited

U.S. PATENT DOCUMENTS

| | | | |
|---|---|---|---|
| 5,845,204 A * | 12/1998 | Chapman et al. | 455/343.1 |
| 6,873,215 B2 * | 3/2005 | Devries et al. | 331/44 |
| 7,355,482 B2 * | 4/2008 | Meltzer | 331/2 |
| 2003/0098733 A1 * | 5/2003 | Saita | 327/291 |
| 2003/0128157 A1 | 7/2003 | Salkhi | |
| 2004/0122565 A1 * | 6/2004 | Sakurai et al. | 701/1 |
| 2005/0007205 A1 * | 1/2005 | Bridger | 331/108 C |
| 2007/0090544 A1 * | 4/2007 | Northcutt | 257/787 |
| 2008/0150797 A1 * | 6/2008 | Jia et al. | 342/357.06 |

OTHER PUBLICATIONS

European Search Opinion—07109449, Search Authority—The Hague-Oct. 30, 2007.
European Search Report—07109449, Search Authority—The Hague-Oct. 30, 2007.

* cited by examiner

*Primary Examiner* — Arnold Kinkead
*Assistant Examiner* — Richard Tan
(74) *Attorney, Agent, or Firm* — Shyam K. Parekh

(57) ABSTRACT

A reference clock circuit (170), has a low-power mode, in which the frequency consumption is reduced, and including an internal counter, accumulating time spent in low-power mode. The circuit includes a crystal resonator (60), an oscillator circuit (70), and a temperature compensation circuit (80), providing a stable clock output (85). During low-power mode temperature compensation can be switched off. The circuit further provides a wakeup signal (107) after a preset time in low-power mode.

20 Claims, 1 Drawing Sheet

REFERENCE OSCILLATOR AND ITS USE

CROSS-REFERENCE TO RELATED APPLICATIONS

The present application claims priority from European Patent Application No. EP 07109449 Filed on Jun. 1, 2007, whose entire contents are incorporated herein by reference.

FIELD OF THE INVENTION

The present invention concerns a clock circuit suitable as time and frequency reference in digital electronic equipment and, in particular, a time and frequency reference circuit having a low-power mode, which is optimized to low-power consumption applications, during which the circuit requires very little power. The present invention is further related with uses of the aforesaid clock circuit in data transmission schemes and in radiolocalization devices.

DESCRIPTION OF RELATED ART

Reliable frequency sources are a constant feature of almost any digital electronic design. An increasing number of application, for example mobile telephony, radiolocalization, digital broadcast, wireless LAN telecommunication, and so on, rely on precisely synchronized time and/or frequency references at both ends of a data transmission link. Clock synchronicity is obtained in various ways, according to the circumstances.

In GNSS radiolocalization receivers, for example, the local clock is in general a high-quality, temperature compensated crystal oscillator (TCXO). The time reference provided by the receiver's clock may be completely uncorrelated, at start-up, with the time reference of the transmitting satellites (the so called "GPS time"). During a preliminary search and acquisition phase, the receiver manages to acquire and decode the ranging signals from the satellites, whereupon a first position fix can finally be obtained. This initial acquisition phase can last up to a few minutes, but can be shortened, by known methods, if the receiver disposes of a sufficiently accurate time estimation at start-up. The same holds true in other context, for example subscribing to a wireless telecommunication network also implies, in general, an initial synchronization step which is advantageous to reduce as much as possible.

In mobile equipment, on the other hand, there is a desire to limit power consumption as much as possible, and this is often achieved by switching off parts of the circuit when they are not needed. In GPS handheld receivers, for example, it is desirable to put the receiver in an idle mode when no fixes are requested, or, when fixes are spaced-apart in time, between these. Preferably, in this case, the system should be able to keep track of time elapsed in idle mode so that, when the receiver wakes up, a time reference is available and the reacquisition of the satellite signals can proceed speedily.

It is known to provide an auxiliary real-time clock (RTC) to keep time while the circuit is in low-power mode or in idle mode. RTC have, in general a separate crystal resonator, often a tuning-fork quartz crystal, oscillating at a frequency of 32.768 kHz, or similar. Such oscillators are optimized for low-power consumption, and can be kept running at all times, without appreciable impact on battery autonomy.

This solution, however, has shortcomings in the additional board space taken up by the RTC and especially by the crystal oscillator, and also in the limited precision of ordinary RTC oscillators. The low precision of the RTC time reference limits the useful duration of the low-power periods. Tuning-fork crystals are also more shock-sensitive than shear-mode high frequency resonators.

On the other hands, if one should adopt a high-precision quartz oscillator to clock the RTC, as it is done for the main clock, this would add appreciably to the device cost.

US2005/0007205 describes a quartz oscillator having two operating modes. In the first mode (normal mode) the oscillator delivers a high-purity, high-frequency clock signal, and optionally a low-frequency signal. In a second, low-power mode, the oscillator provides the low-frequency signal only.

BRIEF SUMMARY OF THE INVENTION

It is therefore an aim of the present invention to provide a device and a use that overcome the above shortcomings. In particular it is an aim of the present invention to provide, in a digital device, a reliable knowledge of absolute time, after a period spent in low-power state.

According to the invention, these aims are achieved by means of the object of the appended claims and, in particular, by a reference oscillator circuit, including: a crystal resonator, having a resonance frequency; an oscillator circuit arranged to maintain the crystal resonator in oscillation at the resonance frequency, and generate an oscillating signal at the resonance frequency, with a temperature compensation circuit, providing a temperature-compensated clock output signal, wherein the reference oscillator circuit has at least one normal operational state and a low-power state, wherein the power consumption of the reference oscillator circuit in the low-power state is lower than the power consumption of the reference oscillator circuit in the normal state, and a command input, arranged to change the state of the reference oscillator circuit according to the value present at the command input, characterized by: a counter, externally accessible by a counter output interface, arranged to count a periodic signal while the reference oscillator circuit is in the low-power state.

According to another aspect, the aims of the invention are achieved by using the reference oscillator circuit in a GNSS receiver, wherein the GNSS receiver has an idle mode, in which satellite tracking is not carried out and the reference oscillator circuit is put into low-power mode, the GNSS receiver being arranged to save a value of the time at which the GNSS receiver enters into idle mode, to retrieve the time elapsed in idle mode from the counter of the reference oscillator circuit, and to resume acquisition and tracking of satellites based on such knowledge of the time elapsed in idle mode.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
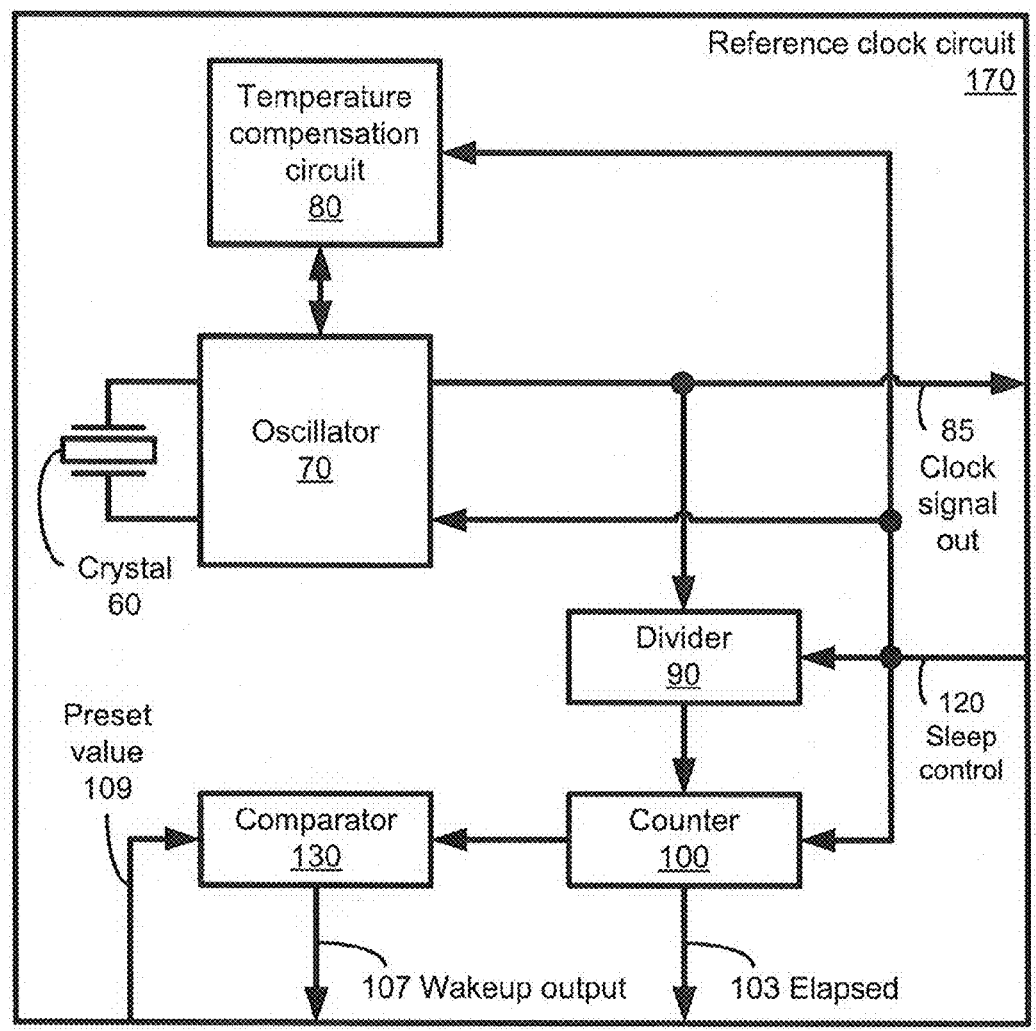
FIG. 1 shows, in a simplified schematic way, the structure of a time and frequency reference circuit according to one aspect of the present invention.

In FIG. 1 is represented a crystal oscillator according to one aspect of the present invention. The reference circuit 170 is preferably contained in one common package. Input pin 120 is used to apply a control logic signal to the oscillator 70, for selecting a normal running mode and a low-power mode. According to one aspect of the invention the reference clock circuit 170 is included in a GPS or GNSS receiver, or in an equivalent host system.

In normal running mode, quartz crystal resonator 60 and oscillator 70 provide a HF clock signal with high spectral purity and low phase noise. Temperature-compensation circuit 80 compensates for the known temperature drift of crystal resonator 60. In a typical TCXO assembly, the temperature compensation unit uses a temperature sensor (a thermistor), thermally linked to the crystal resonator 60, to generate a correction voltage that is applied to a voltage-variable reactance (a varactor diode) in the oscillator circuit. The reactance variations produce frequency changes in the reference clock output 85 that are opposite to the frequency changes resulting from temperature variations. Other temperature compensation methods are known, however, and included in the scope of the present invention.

The reference clock circuit 170 includes a counter 100, and a divider 90, for accumulating a periodic signal, derived from clock signal 85. When the circuit is in normal running mode, divider 90 is disabled. Counter 100 receives no input, and does not change value. Consequently, it does not generate any noise that could impair the quality of the clock signal 85.

Low-power mode is selected, for example, by providing a "1" logical value at the sleep control input 120. In this mode, the temperature compensation circuit can be switched off, disabling clock output 85. At the same time, the divider 90 is enabled and provides a clock signal to the input of counter 100. Preferably the oscillator 70 also reacts to the sleep control input signal 120 by reducing its power consumption, possibly at the expense of stability or noise. The drive of the quartz crystal resonator 60, for example, could be lower in low-power mode than in normal run mode. During low-power mode, the clock signal is simply accumulated into counter 100, and, therefore, phase noise and frequency purity are less of an issue, as long as the average clock rate remains stable.

To further preserve power, oscillator 70 could tune in a different resonant frequency of the crystal resonator 60 when in low power mode, rather than at the resonance used in normal run mode. For example the oscillator could normally operate at the third or fifth overtone, and switch to the fundamental frequency of the crystal resonator 60 in low-power mode. In this way, for example, the circuit could provide a 5 MHz clock, in normal run mode, and count internally the time elapsed in low power mode, with a one µs time base.

In low-power mode the operation of temperature compensation circuit 80 is stopped, and, preferably, no clock signal 85 is generated. Counter 100 then advances according to an uncompensated clock, drifting according to the temperature of crystal resonator 60. This is acceptable, as long as the period spent in low-power mode is short with respect to a typical temperature drift. Optionally, if very high temperature stability is required, the temperature compensation circuit 80 could be kept active, or partially active, also during low-power mode.

According to a non-illustrated variant, the temperature compensation circuit 80, in low power mode, could compute a correction value, accounting for all temperature drift during low-power mode, to be added to the content of counter 100.

According to another variant, the temperature compensation circuit 80, in low power mode, could be operated intermittently, in order to preserve power, and use a sample-and-hold to provide a continuous correction signal to the oscillator 70.

Preferably a reset input of counter 100 is connected to signal 120 so that counter 100 is automatically reset at the transition of signal 120 from "0" to "1". In this way counter 100 accumulates a value proportional to the time elapsed in low-power mode. In alternative, counter 100 could be read at the beginning and at the end of the low-power period, whereby the duration of the low-power period can be computed.

At circuit wakeup, sleep control input signal 120 goes back to "0", temperature compensation circuit 80 is enabled, and the clock signal is again present at clock output 85. At the same time divider 90 is disabled, and no clock pulse reach the counter 100, which is stopped. The content of counter 100 is available to the host system by an appropriate interface 103.

According to a non-illustrated variant of the invention, divider 90 could be dispensed of, and the counter 100 could be stopped in any other known way, for example by another logic element, such as a logic gate. In this case counter 100 could also counts the clock signal at full rate. According to an alternative variant, counter 100 could be kept running at all times, its content being latched in a register when the reference circuit enters normal run mode. In this case the counter 100 shall be realized with low-noise techniques, in order not to introduce phase noise in the reference clock signal 85.

Optionally, the circuit also includes a wakeup output 107, for waking up the host system after a predefined time interval in low-power mode, the wakeup output 107 could generate a signal whenever the counter 100 overflows, or when it exceeds a preset value 109, provided by the host system to comparator 130, or in any other known way.

Figure 2:
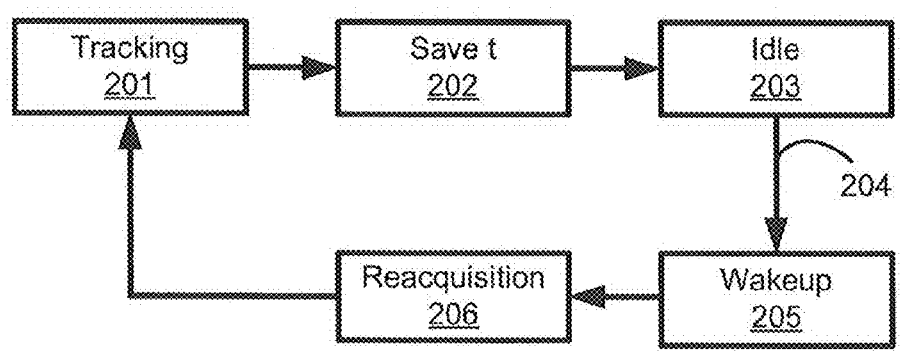
FIG. 2 illustrates a possible use of the circuit of FIG. 1 in a radiolocalization satellite receiver.

FIG. 2 illustrates a sequence of operation of a GPS receiver comprising the time reference of the invention. Initially (state 201) the receiver is tracking satellite's signals, the time reference runs in normal mode and provides a stable HF clock, for example a clock at 5 MHz, 10 MHz, 32.734 MHz, or any other suitable frequency. The system knows the relationship between the time provided by the local clock and the GPS time.

When entering idle mode, the GPS receiver stores (step 202) the absolute time in a memory that will be maintained during the low-power state. Then the GPS enter idle mode, switching off a number of internal subcircuits, and sending an appropriate signal at the input 120 of the clock circuit (state 203) to put it in low-power mode.

The receiver spends a certain time (arrow 204) in low-power mode. This time is accumulated by counter 100 in the reference clock circuit 170. At wakeup (for example because a predefined sleep time has elapsed) the GPS receiver reads the content of counter 100, converts it to appropriate time units, and adds it to the absolute time value stored in step 202.

Since the receiver disposes of a reasonably accurate value of absolute time (for example a value accurate to 1 µs), the reacquisition of GPS satellites (step 206) is immediate, or very quick. The system then resumes tracking (step 201).

Preferably, the GPS receiver delegates to the timer circuit 170 the responsibility to generate a wakeup signal 107, by programming the comparator 130 with an appropriate preset value. In this way, power management in the GPS receiver system can be simplified and optimized. Moreover, The GPS receiver may no longer require an RTC function at all thus reducing the number of power domains at both chip and system level.

The invention claimed is:

1. A reference oscillator circuit comprising:
   a command input to carry a control logic signal setting a normal-running mode and a low-power mode;
   a crystal resonator;

an oscillator coupled to the crystal resonator, the oscillator for providing a temperature-compensated clock output signal;

a temperature compensation circuit coupled to the oscillator;

a logic element coupled to the command input and to the oscillator, wherein the logic element produces a clock pulse based on a signal from the oscillator when in the low-power mode and disables the clock pulse when in the normal-running mode; and a counter coupled to the logic element to receive the clock pulse and to provide a count of clock pulses based on being in the low-power mode.

2. The reference oscillator circuit of claim 1, wherein the oscillator is further coupled to the command input, and wherein the oscillator produces a first frequency when in the normal-running mode and a second frequency when in the low-power mode.

3. The reference oscillator circuit of claim 1, wherein the control logic signal enables the temperature compensation circuit when in the normal-running mode and disables the temperature compensation circuit when in the low-power mode.

4. The reference oscillator circuit of claim 1, wherein the control logic signal enables the temperature compensation circuit when in the normal-running mode and operates the temperature compensation circuit intermittently when in the low-power mode.

5. The reference oscillator circuit of claim 1, wherein the counter is further coupled to the command input and configured to reset the counter when entering the low-power mode.

6. The reference oscillator circuit of claim 1, wherein the counter is further coupled to the command input and configured to stop counting when in the normal-running mode.

7. The reference oscillator circuit of claim 1, wherein the counter comprises an externally accessible counter output interface.

8. The reference oscillator circuit of claim 1, wherein the control logic signal disables the oscillator from providing the temperature-compensated clock output signal when in the low-power mode.

9. The reference oscillator circuit of claim 1, wherein the logic element comprises a divider.

10. The reference oscillator circuit of claim 1, further comprising a comparator coupled to the counter and configured provide a wakeup signal when the count of clock pulses reaches a preset value.

11. A method of providing a temperature-compensated clock output signal from a reference oscillator circuit, the method comprising:
accepting a control logic signal from a command input, wherein the control logic signal sets a normal-running mode and a low-power mode;
disabling a logic element from producing a dock pulse when entering the normal-running mode;
providing the temperature-compensated clock output signal from an oscillator coupled to a crystal resonator and a temperature compensation circuit when in the normal-running mode;
providing clock pulses from the logic element to a counter to count based on being in the low-power mode; and
counting based on the clock pulse from the logic element when in the low-power mode.

12. The method of claim 11, further comprising:
producing a first frequency for the temperature-compensated clock output signal when in the normal-running mode; and
producing a second frequency when in the low-power mode.

13. The method of claim 11, further comprising:
enabling the temperature-compensated circuit when in the normal-running mode; and
disabling the temperature-compensated circuit when in the low-power mode.

14. The method of claim 11, further comprising:
enabling the temperature-compensated circuit when in the normal-running mode; and
operating the temperature-compensated circuit intermittently when in the low-power mode.

15. The method of claim 11, further comprising resetting the counter when entering the low-power mode.

16. The method of claim 11, further comprising disabling the counter when entering the normal-running mode.

17. The method of claim 11, further comprising providing an externally accessible counter output from the counter.

18. The method of claim 11, further comprising disabling the oscillator from providing the temperature-compensated clock output signal when in the low-power mode.

19. The method of claim 11, wherein the act of providing clock pulses from the logic element comprises providing the clock pulses from a divider.

20. The method of claim 11, further comprising providing a wakeup signal from a comparator when the counting reaches a preset value.

* * * * *